(12) United States Patent
Konishi

(10) Patent No.: US 7,053,948 B2
(45) Date of Patent: May 30, 2006

(54) SOLID-STATE IMAGE PICKUP DEVICE WITH DISCHARGE GATE OPERABLE IN AN ARBITRARY TIMING

(75) Inventor: Tomohiro Konishi, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 745 days.

(21) Appl. No.: 09/777,314

(22) Filed: Feb. 5, 2001

(65) Prior Publication Data

US 2001/0023919 A1    Sep. 27, 2001

(30) Foreign Application Priority Data

Mar. 22, 2000    (JP) .............................. 2000-080193

(51) Int. Cl.
*H04N 3/14* (2006.01)
*H04N 5/335* (2006.01)

(52) U.S. Cl. ...................... 348/311; 348/249; 348/250; 348/282; 348/298

(58) Field of Classification Search ................ 348/311, 348/249, 250, 282, 294, 298, 314
See application file for complete search history.

(56) References Cited

U.S. PATENT DOCUMENTS

| | | | | |
|---|---|---|---|---|
| 4,513,313 A | * | 4/1985 | Kinoshita et al. | ........... 348/283 |
| 4,912,560 A | * | 3/1990 | Osawa et al. | ................ 348/313 |
| 5,270,558 A | * | 12/1993 | Reich et al. | ................. 257/223 |
| 5,357,129 A | * | 10/1994 | Kamimura | .................. 257/239 |
| 5,440,343 A | * | 8/1995 | Parulski et al. | ............. 348/316 |
| 5,828,406 A | * | 10/1998 | Parulski et al. | .......... 348/220.1 |

FOREIGN PATENT DOCUMENTS

| | | |
|---|---|---|
| JP | 59-201589 | 11/1984 |
| JP | 63-062480 | 3/1988 |
| JP | 1-303975 | 12/1989 |
| JP | 04-362879 | 12/1992 |
| JP | 4-369266 | 12/1992 |
| JP | 2000-134540 | 5/2000 |
| JP | 2001-053267 | 2/2001 |
| JP | 2001-238134 | 8/2001 |

\* cited by examiner

*Primary Examiner*—David Ometz
*Assistant Examiner*—Gevell Selby
(74) *Attorney, Agent, or Firm*—David G. Conlin; Steven M. Jensen; Edwards Angell Palmer & Dodge LLP

(57) ABSTRACT

A solid-state image pickup device has a discharge gate and a discharge drain provided adjacent to a connection of a vertical CCD and a horizontal CCD so that charges accumulated for an arbitrary pixel can be completely depleted. Data can be read at an arbitrary decimation rate only by changing a drive condition of the discharge gate. An arbitrary decimation rate can be achieved and a frame rate, resolution or the like can easily changed while vertical transfer electrodes can keep the same wiring structure as in a still mode (normal reading) without making a complicated wiring structure of vertical transfer electrodes such as the prior art. Therefore, this solid-state image pickup device can achieve an arbitrary decimation rate and easily change a frame rate, resolution or the like only by changing drive conditions without making a complicated wiring structure of vertical transfer electrodes.

9 Claims, 17 Drawing Sheets

(NORMAL TRANSFER MODE)

t=t₁ t=t₂ t=t₃

(NORMAL TRANSFER MODE)

t=t₂ t=t₃ t=t₄

US 7,053,948 B2

SOLID-STATE IMAGE PICKUP DEVICE WITH DISCHARGE GATE OPERABLE IN AN ARBITRARY TIMING

BACKGROUND OF THE INVENTION

The present invention relates to a solid-state image pickup device, in particular, a solid-state image pickup device for reading decimated signals.

A conventional two-dimensional image sensor will be described below. FIG. 14 shows a solid-state image pickup device using conventional CCD (charge coupled device). In FIG. 14, reference numeral 101 denotes a light receiving section (photodiode), 102 denotes a vertical CCD, 103 denotes a horizontal CCD, 104 denotes an charge voltage converting section, 105 denotes an amplifier, 106 denotes a vertical transfer electrode, and 107 denotes a horizontal transfer electrode.

A two-dimensional image sensor has a higher-density pixels. Particularly, a digital still camera having more than 2 million pixels is becoming a mainstream.

In an image pickup device represented by a high-pixel digital still camera, in general, operation is performed by switching between a drive method where all pixel data is read and processed and a drive method for processing only part of all pixel data by decimation.

The former is a still picture pickup mode mainly for printer output, that is, a still mode and the latter is a dynamic image pickup mode mainly for adjusting a face outline of a subject by monitor output, that is, a monitoring mode.

Operation in a monitoring mode will be described below.

FIG. 15 shows a device configuration used in the following description. In FIG. 15, reference numeral 101 denotes a light receiving section, 102 denotes a vertical CCD, 103 denotes a horizontal CCD, 106 denotes a vertical transfer electrode, 107 denotes a horizontal transfer electrode, and 108 denotes a shielded pixel. This monitoring-mode decimation method is a 1/7 decimation mode for reading 1 pixel out of 7 pixels.

As shown in FIG. 15, the vertical transfer electrodes 106 operate in units of 6-phase gate voltages, $\phi_{V1A}$, $\phi_{V1B}$, $\phi_{V2}$, $\phi_{V3A}$, $\phi_{V3B}$, $\phi_{V4}$, applied to 28 gates. The gate voltages $\phi_{V1A}$, $\phi_{V1B}$ and $\phi_{V3A}$, $\phi_{V3B}$ are used to read a signal charge from a photodiode. The gate voltages $\phi_{V2}$, $\phi_{V4}$ are used only for transferring the signal charge.

FIG. 16 shows drive timings in a monitoring mode. FIG. 17 shows the relationship of potentials at each time of t1–t5. In FIG. 16, Tm is a period of one cycle of a vertical transfer in a monitoring mode, which is a quarter of the period Ts of one cycle of a vertical transfer in a still mode.

In this monitoring mode, the same signals are read in respective fields. First, a corresponding signal R (G) is read by a gate voltage $\phi_{V1A}$ at t1. Since 6 gates have a gate voltage $\phi_{V1B}$ whereas only 1 gate has a gate voltage $\phi_{V1A}$ in one unit, the read signal R (G) has 1/7 of data amount in one field in a still mode.

At t2, a signal for 1 pixel read by the gate voltage $\phi_{V1A}$ is transferred by 6-phase gate voltages $\phi_{V1A}$–$\phi_{V4}$ and a signal G (B) is read by a gate voltage $\phi_{V3A}$.

The read signal has 1/7 of data amount in another field in a still mode as in the case of R (G). Subsequently, at t3, respective signals of R (G) and G (B) for 1 pixel are transferred. With the above operation, signals each containing a color component of R, G and B are read in units of fields.

The read signals are arrayed in a packet in a vertical CCD as shown in FIG. 17. In units of 7 packets per 14 pixels, signals of different color components for 2 pixels are arrayed at intervals of 2 packets (4 pixels) or 3 packets (6 pixels).

Subsequently, these signals for 4 vertical transfer stages (8 pixels) are continuously transferred at high speed during a horizontal blanking period. Consequently, a signal of G (B) is transferred to a horizontal CCD while a signal R (G) to be read to the horizontal CCD during the next horizontal blanking period is transferred to a vicinity of the horizontal CCD (at t4) at the same time. During the subsequent horizontal blanking period, 3 stages (6 pixels) are transferred continuously and a signal of R (G) is transferred to the horizontal CCD while the signal G (B) to be read subsequently is transferred to the vicinity of the horizontal CCD at the same time.

Subsequently, signals arrayed at intervals of empty packets in the vertical CCD can be extracted continuously from the horizontal CCD by alternately repeating 4 stages and 3 stages of the vertical transfer.

Thus, data for 1 screen is read over 2 fields in a still mode whereas data for 1 screen is decimated to 1/7 in a monitoring mode and can be read in 2/7 time of 1 field. Therefore, data is processed at 1/7 of the frame rate in a still mode in total.

For example, when an image pickup device having 3 million pixels is operated with a total number of 44 million clocks per 1 frame in a clock frequency of 18 MHz, time required to extract data for 1 screen is about 1/4 seconds in a still mode and about 1/29 seconds in a monitoring mode. Therefore, a smooth dynamic image can be obtained in a monitoring mode as in the case of 1/30 seconds, which is a frame rate for the TV format according to the NTSC (National Television System Committee).

Besides 1/7 decimation, various decimation rates such as 1/4, 1/5, 1/6, 1/8 and the like are employed in a monitoring mode. The decimation rate is determined by the total number of pixels in an image pickup device, the number of pixels required for dynamic images and the frame rate.

Originally, a vertical transfer is performed in units of 4-phase gate voltages, $\phi_{V1}$, $\phi_{V2}$, $\phi_{V3}$, $\phi_{V4}$ applied to 4 gates in a still mode, which is a normal transfer mode.

However, as described in the prior art, for example, when 1/7 decimation is performed in a monitoring mode, vertical transfer electrodes require 6-phase gate voltages $\phi_{V1A}$, $\phi_{V1B}$, $\phi_{V2}$, $\phi_{V3A}$, $\phi_{V3B}$, $\phi_{V4}$ applied to 28 gates as one unit. Therefore, a complicated transfer gate wiring structure is required to achieve a monitoring mode.

For example, in the case of 1/4 decimation, one unit is 6-phase gate voltages applied to 8 gates. In the case of 1/5 decimation, one unit is 6-phase gate voltages applied to 20 gates. Thus, one unit varies depending on the decimation rate. Different transfer gate wiring structures need to be designed depending on the total number of pixels in the image pickup device, the number of pixels required for dynamic images and the frame rate.

Further, to achieve two or more different monitoring modes in one device, the electrode wiring becomes very complicated since a combination of electrode wiring structures for respective decimation rates are required. The decimation rate of a monitoring mode cannot be changed by changing a drive timing alone. The electrode wiring of a sensor section corresponding to a desired monitoring mode needs to be formed in advance.

SUMMARY OF THE INVENTION

Accordingly, an object of the present invention is to provide a solid-state image pickup device which can achieve an arbitrary decimation rate without making a complicated wiring structure of vertical transfer electrodes and easily change a frame rate, resolution and the like only by changing drive conditions.

In order to achieve the above object, there is provided a solid-state image pickup device comprising a plurality of light receiving sections formed on a semiconductor substrate, vertical transfer sections for transferring charges read from the light receiving sections in a vertical direction and a horizontal transfer section for transferring charges transferred by the vertical transfer sections in a horizontal direction, wherein said solid-state image pickup device is provided with a charge discharge gate which is formed adjacent to a connection of the vertical transfer section and the horizontal transfer section and depletes charges in the vertical transfer section and a charge discharge drain formed adjacent to the charge discharge gate, and signal charges in an arbitrary vertical transfer section are discharged from the charge discharge gate to the charge discharge drain by applying a voltage to the charge discharge gate in an arbitrary timing.

In the present invention, a discharge gate and a discharge drain are provided at a connection of a vertical transfer section and a horizontal transfer section. In this structure, charges accumulated for an arbitrary pixel can be completely depleted. Signal charges for a pixel to be decimated are discharged to the discharge drain by turning on the discharge gate. Signal charges for other pixels are not discharged to the discharge gate and transferred to the horizontal CCD by turning off the discharge gate. By using this structure and drive method, data can be read at an arbitrary decimation rate.

Consequently, a monitoring mode (decimated reading) can be achieved while vertical transfer electrodes have the same wiring structure as in a still mode (normal reading) without making a complicated vertical transfer electrode wiring structure such as the one in the prior art. In addition, an arbitrary decimation rate can be achieved and a frame rate, resolution and the like can be easily changed only by changing the drive condition of the discharge gate.

In one embodiment of the present invention, a layer directly under the gate having the same conductive type as that of the vertical transfer section is formed under the discharge gate positioned between the vertical transfer section and the discharge drain.

In this embodiment, since the layer directly under the discharge gate has the same conductive type as that of the vertical transfer section, the potential distribution under the discharge gate can make a downward slope without a hump towards the discharge drain when a high-level voltage is applied to the discharge gate as shown with a broken line in FIG. 4B. Thus, the vertical transfer section is completely depleted and charges can be discharged to the discharge drain.

In one embodiment of the present invention, a layer directly under the gate having the same conductive type as that of the vertical transfer section is formed under the discharge gate positioned between the vertical transfer section and the discharge drain in the same process of forming the vertical transfer section.

In this embodiment, when the vertical transfer section is formed, a region having the same conductive type as the vertical transfer section is formed at the same time. The layer directly under the discharge gate is formed so as to be in the same implanted layer as the vertical transfer section. In this case as well, the vertical transfer section is completely depleted and charges can be discharged to the discharge drain.

In one embodiment of the present invention, the discharge gate covers at least part of the vertical transfer section.

In this embodiment, the discharge gate covers at least part of the vertical transfer section. Therefore, at the time of a transfer, a potential slope is formed in a transfer direction without forming a potential barrier or a potential dip. Therefore, charges in a packet in the vertical transfer section can be completely depleted without causing a defective transfer.

In one embodiment of the present invention, a voltage applied to the discharge drain is made variable and a drive timing of a voltage applied to the discharge drain is synchronized with a drive timing of a voltage applied to the discharge gate.

In this embodiment, a voltage applied to the discharge drain is made variable and a drive timing of a voltage applied to the discharge drain is synchronized with a drive timing of a voltage applied to the discharge gate. Consequently, at the time of a normal charge transfer, leakage of charges to the discharge drain can be prevented by making a potential well of the discharge drain shallow. At the time of a charge discharge operation, charges can be reliably discharged from the vertical transfer section to the discharge drain by making the potential well of the discharge drain deep.

In one embodiment of the present invention, a pulse width applied to the discharge drain covers at least a pulse applied to the discharge gate in a discharge operation mode where the discharge drain is driven while synchronized with driving of the discharge gate.

In this embodiment, a pulse covering the pulse applied to the discharge gate is applied to the discharge drain in a discharge operation mode where the potential in a region under the discharge gate is lowered. Consequently, the charge discharge operation can be reliably performed.

In one embodiment of the present invention, one discharge drain is provided between the neighboring vertical transfer sections and signal charges in the two vertical transfer sections positioned on both sides of the discharge drain are discharged to this one discharge drain via the discharge gate provided adjacent to the vertical transfer sections.

In this embodiment, one discharge drain is shared by two vertical transfer sections so that the pixel pitch can be reduced and sufficient areas for forming the discharge drain and the discharge gate can be secured even when the pixel size is small.

In one embodiment of the present invention, the vertical transfer section provided with the discharge drain and the vertical transfer section not provided with the discharge drain are arbitrarily set and the combinations of the set discharge drains are arranged on a plurality of stages in the vertical direction.

In this embodiment, the horizontal pitch can be reduced since a plurality of stages of discharge drains are provided in a vertical direction.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The solid-state image pickup device of the present invention will be described in detail below with reference to embodiments shown in drawings.

First Embodiment

Figure 1A:
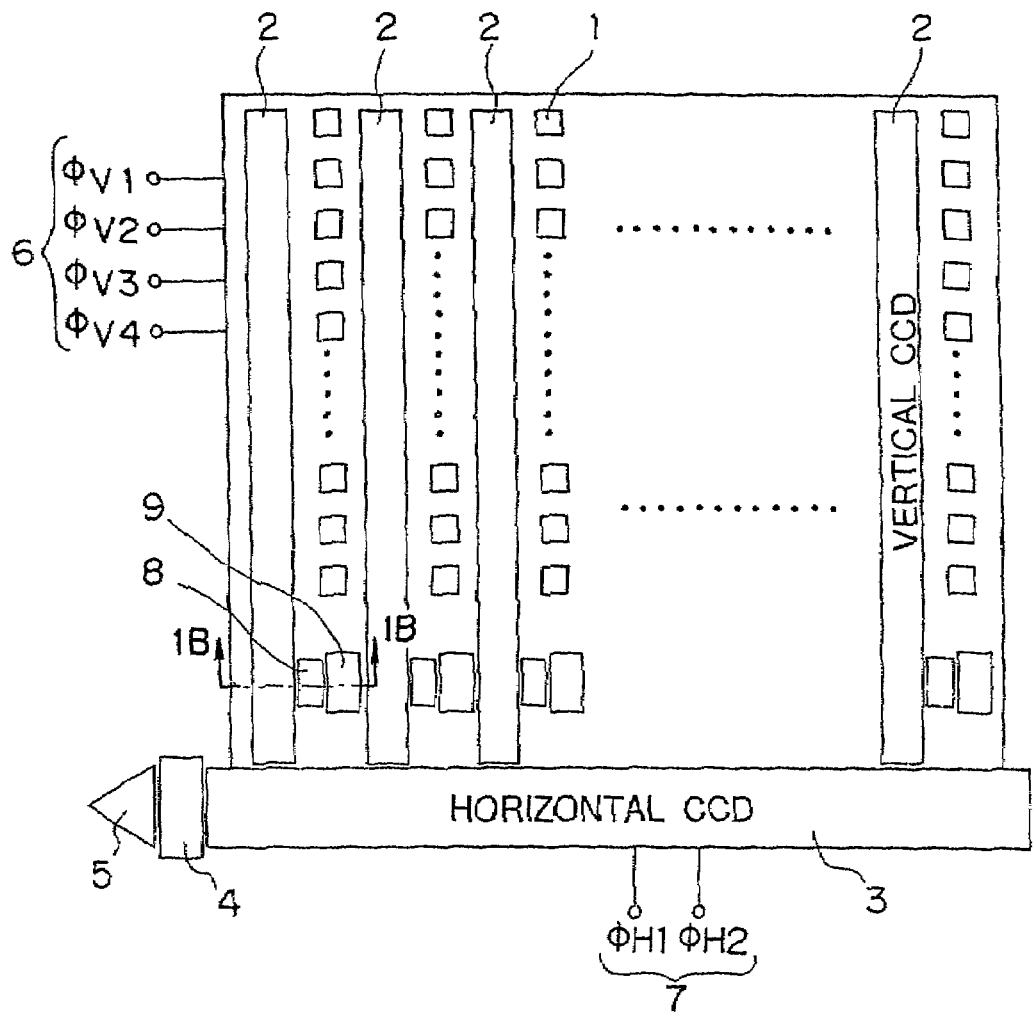
FIG. 1A is a schematic view showing a structure of a two-dimensional image sensor, which is a solid-state image pickup device according to a first embodiment of the invention.
Figure 1B:
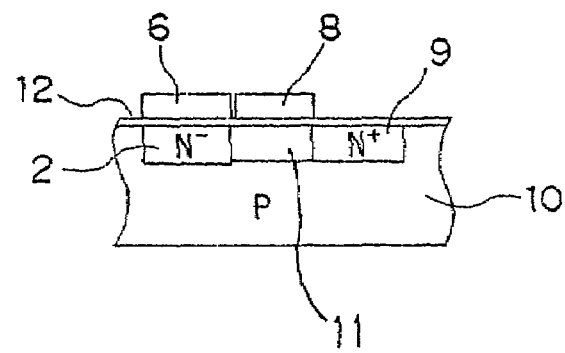
FIG. 1B is a cross sectional view along 1B—1B in FIG. 1A.

FIGS. 1A and 1B show a two-dimensional image sensor using CCD (Charge Coupled Device) as an embodiment of the solid-state image pickup device according to the present invention.

As shown in FIG. 1A, this two-dimensional image sensor is provided with a plurality of vertical CCD 2 arrayed at predetermined intervals and a plurality of light receiving sections 1, 1, 1 . . . , each composed of a photodiode, which are arrayed between these vertical CCD 2. One horizontal CCD 3 is disposed adjacent to one end of the vertical CCD 2, 2, 2 . . . . A charge voltage converting section 4 and an amplifier 5 are successively disposed at one end of the horizontal CCD 3. The vertical CCD 2 has vertical transfer electrodes 6 and the horizontal CCD 3 has horizontal transfer electrodes 7. In this embodiment, the vertical CCD 2, the horizontal CCD 3 and the discharge drain region 9 are n-type semiconductor layers.

As shown in FIG. 1B, the vertical CCD 2 is formed in a Si substrate 10 made of p-type semiconductor. The vertical transfer electrodes 6 are disposed on the vertical CCD 2 with a gate insulating film 12 therebetween. A discharge gate 8 is disposed adjacent to the vertical transfer electrodes 6. A discharge gate Vth control implanted region 11 is formed under the discharge gate 8 with the gate insulating film 12 therebetween. Further, a discharge drain 9 is formed adjacent to this implanted region 11.

As shown in FIG. 1A, the discharge gate 8 and the discharge drain 9 are disposed adjacent to the connection of the vertical CCD 2 and the horizontal CCD 3.

When a high gate voltage is applied to the discharge gate 8 to turn on the discharge gate 8, charges in the vertical CCD 2 are transferred to the discharge drain 9. Charges in a packet in the vertical CCD 2 are completely depleted. On the other hand, when a low gate voltage is applied to the discharge gate 8 to turn off the gate, charges in the vertical CCD 2 are not transferred to the discharge drain 9, but transferred in a vertical transfer direction as normal.

Figure 2A:
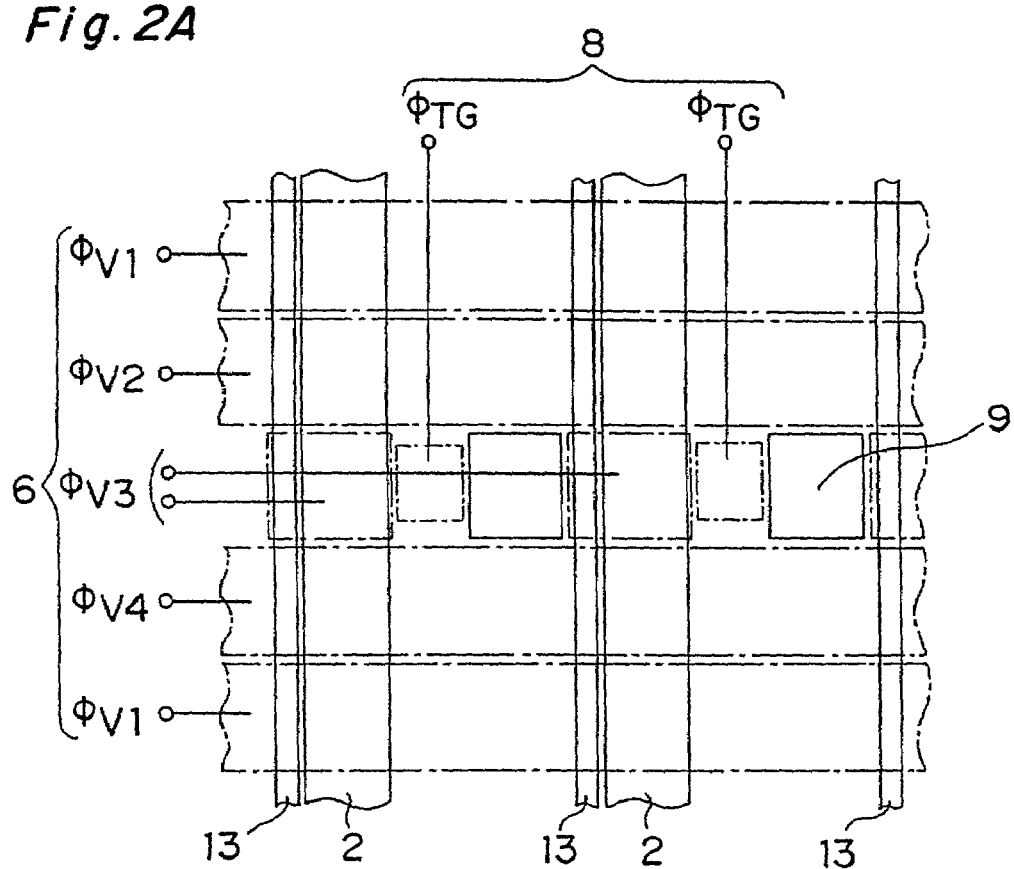
FIG. 2A is a layout chart of a discharge section according to the first embodiment.
Figure 2B:
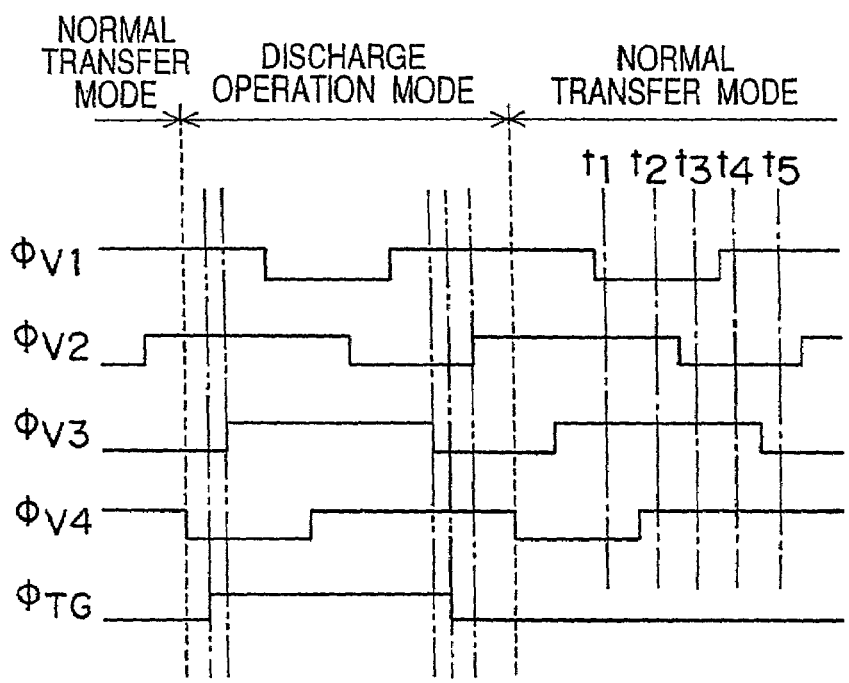
FIG. 2B is a drive timing chart at the time of a discharge operation in the first embodiment.

FIG. 2A shows the layout of the vertical CCD 2, the discharge gate 8 and the discharge drain 9 according to this embodiment. FIG. 2B shows the drive timing. In FIGS. 2A and 2B, $\phi_{V1}$–$\phi_{V4}$ are drive voltages of the vertical CCD 2. $\phi_{TG}$ is the drive voltage of the discharge gate 8.

First, the gate voltage $\phi_{TG}$ is made high and a high voltage is applied to the discharge gate 8 as shown in FIG. 2B so that a potential well under the discharge gate 8 is made deeper than that of the potential of vertical CCD 2 at the time of a discharge operation. At this time, the potential well of the discharge drain 9 is set to be deeper than the potential well under the discharge gate 8. Charges in the vertical CCD 2 can be transferred to the discharge drain 9 by this voltage relationship.

At the time of a normal transfer, a low voltage (gate voltage $\phi_{TG}$) is applied to the discharge gate 8 and the potential well under the discharge gate 8 is made approximately equal to (or shallower than) the potential well of the vertical CCD 2 under the transfer electrodes 6 to which a low voltage is applied. Consequently, charges in the vertical CCD are not discharged to the discharge drain 8, but transferred in a transfer direction.

Thus, monitoring-mode operation is enabled by using the charge discharge function of the above-described discharge gate 8.

The monitoring-mode operation using the discharge gate 8 and the discharge drain 9 will be described below. It is noted that the decimation method in this monitoring mode is a 1/7 decimation mode where 1 pixel out of 7 pixels is read.

First, as in the case of a still mode (normal reading), pixel signals of odd-numbered (or even-numbered) columns are read from photodiodes 1 to the vertical CCD 2. The vertical CCD 2 are formed so that 1 packet has 2 pixels. The charges read to the vertical CCD 2 are transferred towards the horizontal CCD 2 up to a portion of the vertical CCD 2 adjacent to the discharge gate 8, which is provided in the vicinity of the connection of the vertical CCD 2 and the horizontal CCD 3.

Figure 3:
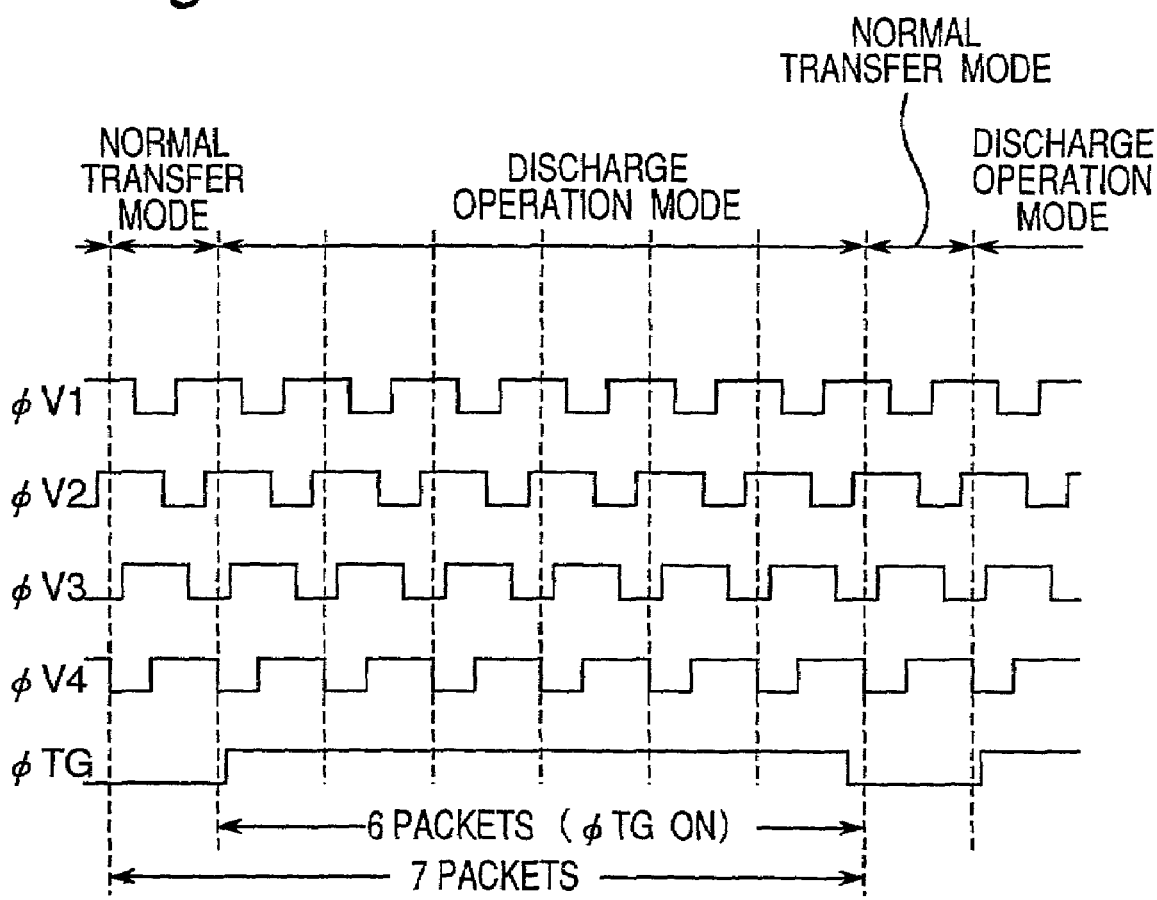
FIG. 3 is a drive timing chart in a monitoring mode according to the first embodiment.

FIG. 3 shows an example of the drive timing of the vertical CCD 2 and the discharge gate 8 in a 1/7 decimation mode. In this example, the vertical CCD 2 operates in the same drive timing as at the time of a normal transfer (still mode).

Then, the gate voltage $\phi_{TG}$ is applied to the discharge gate 8 to turn off the gate for 1 packet (2 pixels) out of 7 packets (14 pixels) and the gate is turned on for 6 packets. That is, the discharge gate 8 is turned on for 6 packets out of 7 packets so that the signal quantity transferred by the vertical CCD 2 can be decimated to 1/7 (operation in field A).

Subsequently, pixel signals of even-numbered (or odd-numbered) columns are read from photodiodes 1 to the vertical CCD 2. Charges read to the vertical CCD 2 are transferred towards the horizontal CCD 3 up to a portion of the vertical CCD 2 adjacent to the discharge gate 8, which is provided in the vicinity of the connection of the vertical CCD 2 and the horizontal CCD 3. As in the case of field A, the discharge gate 8 is turned off for 1 packet (2 pixels) out of 7 packets (14 pixels) and the discharge gate 8 is turned on for the remaining 6 packets (12 pixels) to perform a discharge operation (operation in field B).

At this time, assuming 7 packets (14 pixels) as one unit in field A and field B combined, signals for 2 pixels of different color components are outputted in units of 3 packets (6 pixels) or 4 packets (8 pixels).

In this embodiment, the drive method and operation in a 1/7 decimation mode is described, but it is obvious that any decimation operation such as 1/4, 1/5, 1/6, 1/8 or the like can be achieved by changing the drive timing. Pixel signals for performing this decimation are discharged by turning on the discharge gate 8. Required pixel signals are transferred from the vertical CCD 2 towards the horizontal CCD 3 by turning off the discharge gate 8. That is, an arbitrary decimation can be performed according to the timing of voltages applied to the discharge gate 8.

Pixel decimation (monitoring mode) in interline CCD is described in this embodiment, but decimation is enabled in progressive scan CCD as well and any arbitrary decimation can be performed by using a discharge gate 8 and a discharge drain 9.

As described above, by using the structure according to the embodiment, the vertical CCD 2 is driven in the same the drive timing as in a normal transfer (still mode) and a monitoring-mode operation at an arbitrary monitoring rate is enabled only by changing the drive timing of voltages applied to the discharge gate 8. This shows that decimation can be achieved without using a complicated structure of vertical transfer electrodes such as the one in the prior art.

Figure 4A:
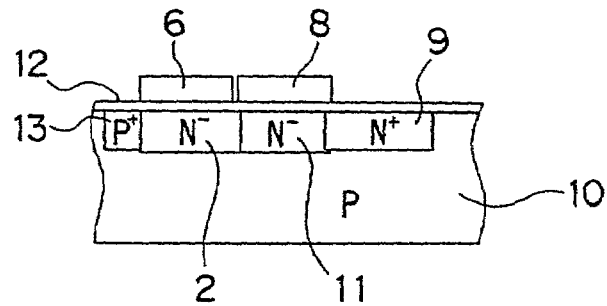
FIG. 4A is a cross sectional view of the structure of the discharge section according to the first embodiment.
Figure 4B:
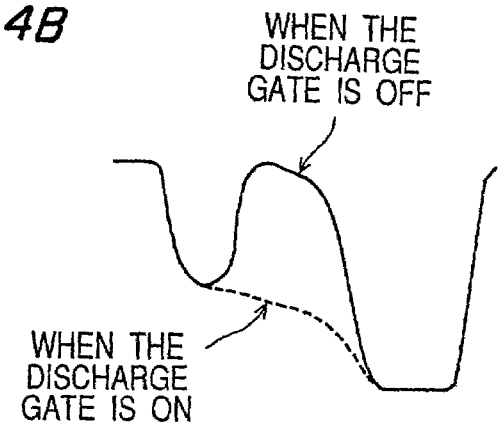
FIG. 4B is a potential distribution view corresponding to FIG. 4A.

FIG. 4A shows the structure according to the first embodiment where the discharge gate Vth control implanted region 11 under the discharge gate 8 has the same conductive type as that of the vertical CCD 2. FIG. 4B shows the potential relationship in this structure.

As shown in FIG. 4A, the vertical CCD 2 is disposed under the vertical transfer electrode 6 with a gate insulating film 12 therebetween. The discharge gate Vth control implanted region 11 is formed adjacent to the vertical CCD 2. The discharge drain 9 is formed adjacent to this implanted region 11. A channel stop 13 is disposed adjacent to the vertical CCD 2 on the opposite side of the implanted region 11. The discharge gate 8 is disposed adjacent to the vertical transfer electrodes 6 and vertically opposed to the implanted region 11. Numeral 10 denotes a Si substrate.

In the configuration shown in FIG. 4A, since the implanted region 11 under the discharge gate 8 has the same conductive type as that of the vertical CCD 2, the potential distribution under the discharge gate 8 towards the discharge drain 9 can make a downward slope without a bump when a high voltage is applied to the discharge gate 8 as shown with a broken line in FIG. 4B. Therefore, charges in the vertical CCD 2 are completely depleted and the charges can be discharged to the discharge drain 9. It is noted that the implanted region 11 under the discharge gate 8 may be formed by forming a region having the same conductive type as that of the vertical CCD 2 and making the region in the same implanted layer together with the vertical CCD 2 when the vertical CCD 2 are formed. In this case as well, charges in the vertical CCD 2 are completely depleted and the charges can be discharged to the discharge drain 9.

Figure 4C:
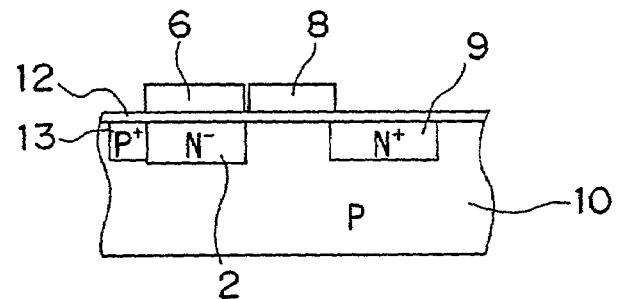
FIG. 4C is a sectional view of a structure of a discharge part as a comparative example.
Figure 4D:
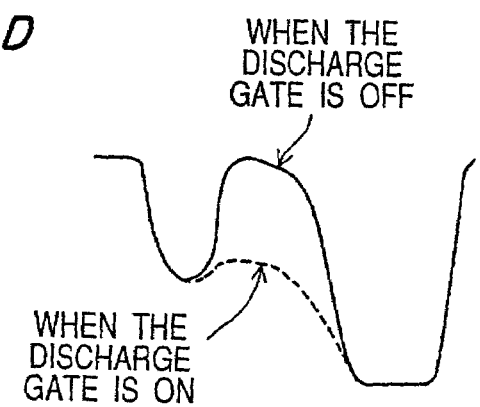
FIG. 4D is a potential distribution view corresponding to FIG. 4C.

In contrast to the structure shown in FIG. 4A, if the region under the discharge gate 8 does not have the same conductive type as the vertical CCD 2 as shown in FIG. 4C, a hump occurs in the potential distribution under the discharge gate 8 as shown with a broken line in FIG. 4D when a high voltage is applied to the discharge gate 8. Therefore, charges in the vertical CCD 2 cannot be completely depleted.

Second Embodiment

Figure 5A:
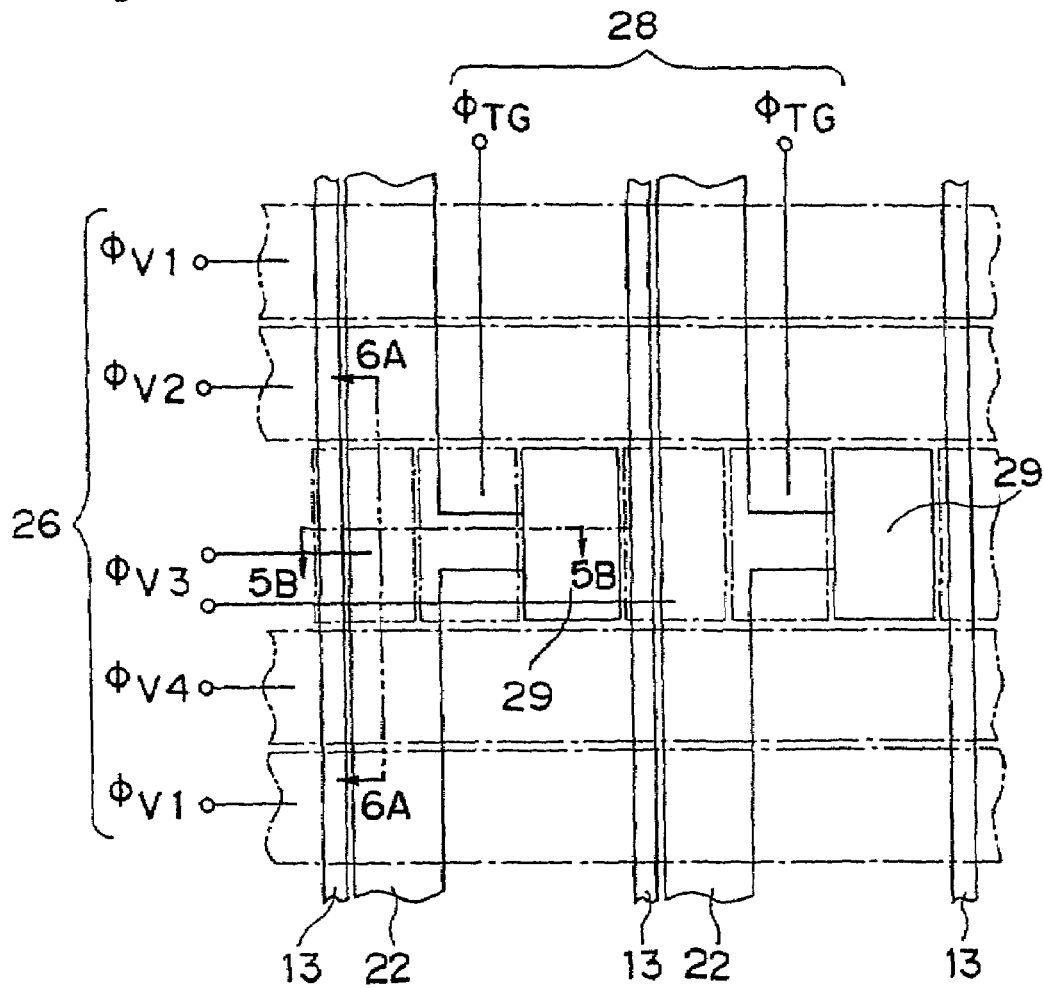
FIG. 5A is a layout chart showing a structure according to a second embodiment of the invention.

FIG. 5A shows a structure according to a second embodiment of the invention. In the second embodiment, the discharge gate 28 covers part of the vertical CCD 22. In FIG. 5A, reference numeral 22 denotes a vertical CCD, 26 denotes a vertical transfer electrode, 28 denotes a discharge gate, 29 denotes a discharge drain, and 13 denotes a channel stop.

The second embodiment has a structure for preventing leftover charges, which occurs when the discharge gate 28 and the vertical CCD 22 do not overlap. The discharge gate 28 covers part of the vertical CCD 22.

Figure 5B:
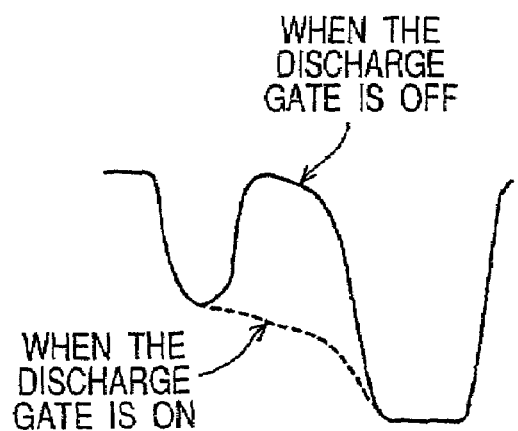
FIG. 5B is a cross sectional view of the potential distribution along 5B—5B in FIG. 5A.

FIG. 5B is a cross section view of the potential distribution along 5B-5B in FIG. 5A. When a high voltage is applied to the discharge gate 28, the potential distribution shown with a broken line is obtained and charges are discharged from the vertical CCD 22 towards the discharge drain 29.

Figure 6A:
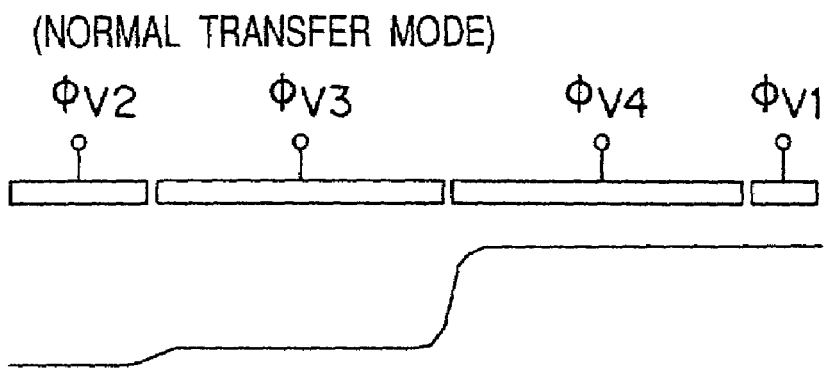
FIGS. 6A–6C show potential distributions in a vertical transfer direction in a normal transfer mode of the second embodiment in the order of transfers.
Figure 6B:
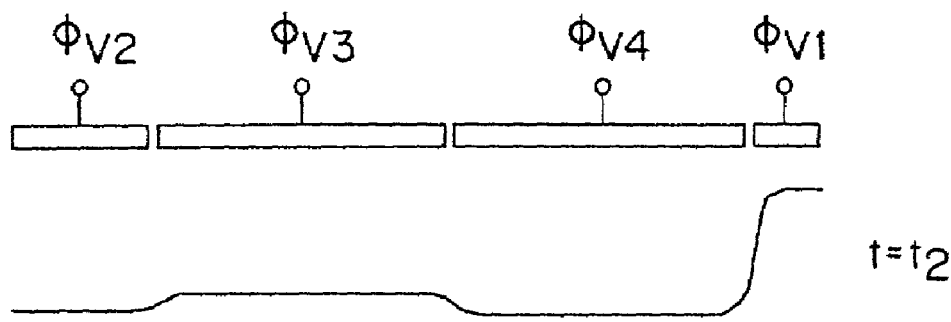
Figure 6C:
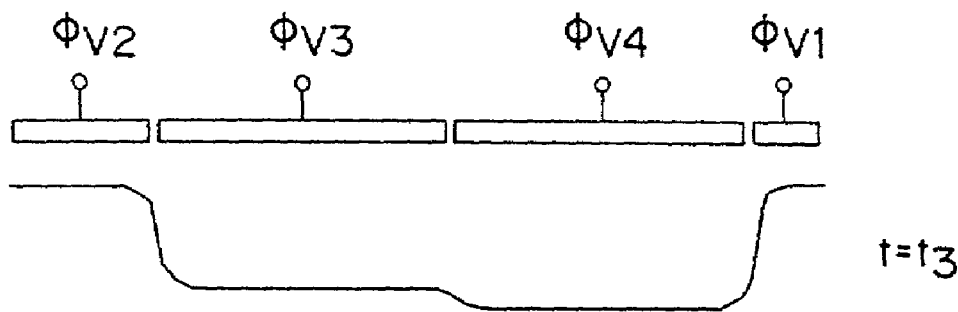

On the other hand, FIGS. 6A–6C are cross sectional views of the potential distribution along 6A—6A in FIG. 5A. These potential distributions are not in a discharge mode, but in a normal transfer mode.

As shown in FIG. 6B, the potential well of the vertical CCD 22 is shallow in a portion adjacent to the discharge gate 28 at t=t2. This is considered to be due to a narrow channel effect. However, at the time of a transfer, that is, when t=t3, a potential slope is formed in a transfer direction without forming a potential barrier or a potential dip. It is noted that drive pulse time t=$t_1$–$t_5$ in FIG. 2B is used for the temporal changes of the potential in FIGS. 6A–6C ($t_1$, $t_2$, $t_3$).

Thus, since the discharge gate 28 covers part of the vertical CCD 22, charges in a packet in the vertical CCD 22 can be completely depleted without causing a defective transfer.

Figure 7A:
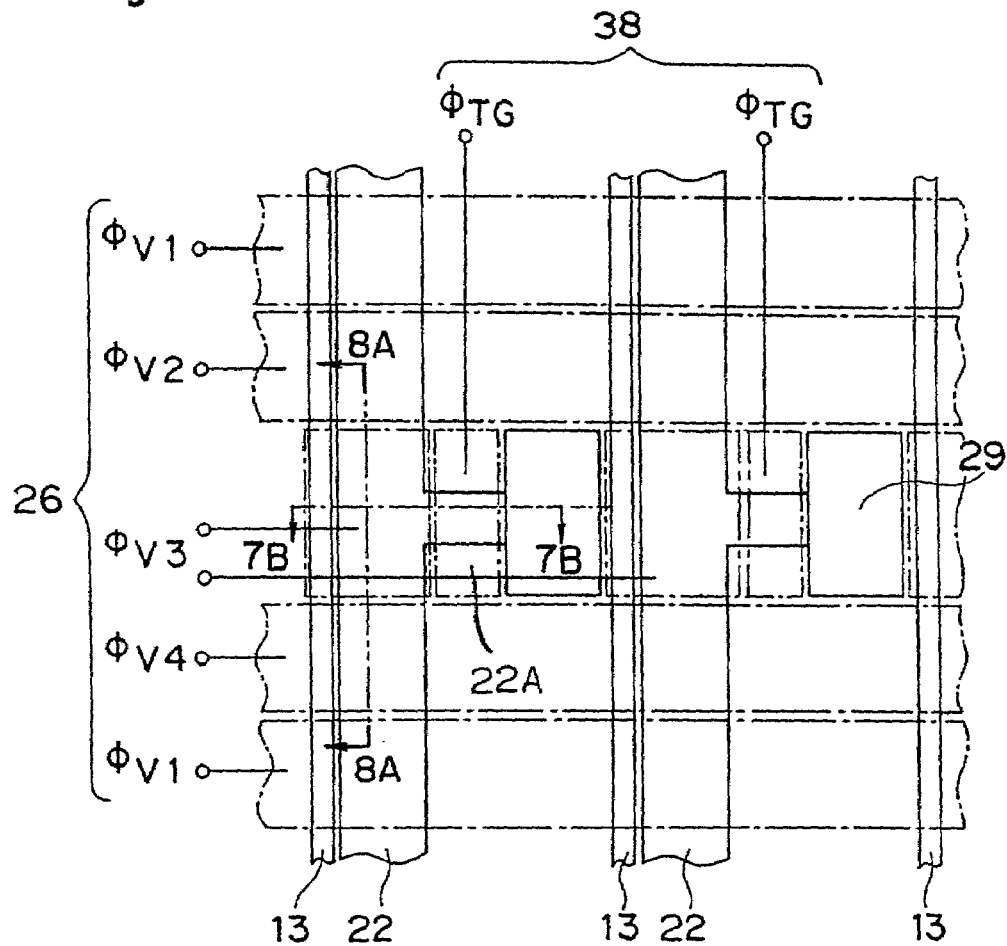
FIG. 7A is a layout chart showing a structure of the comparative example of the second embodiment.
Figure 7B:
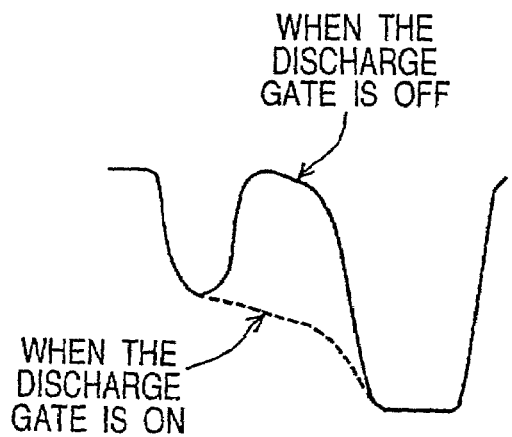
FIG. 7B is a cross sectional view of the potential distribution along C–C' in FIG. 7A.
Figure 8A:
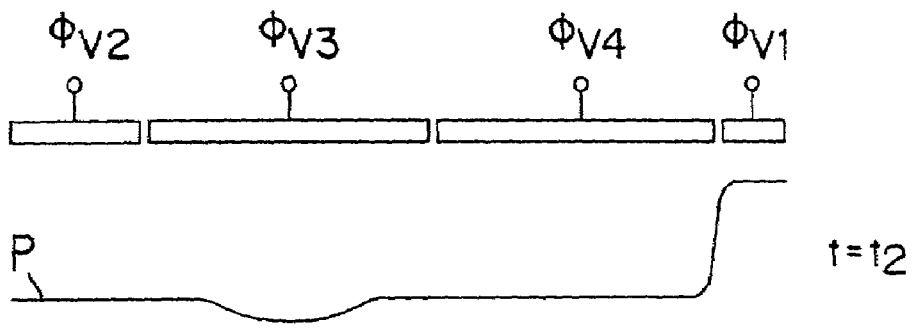
FIGS. 8A–8C are cross sectional views of the potential distribution along 8A—8A in FIG. 7A showing the potential distributions in the order of transfers.
Figure 8B:
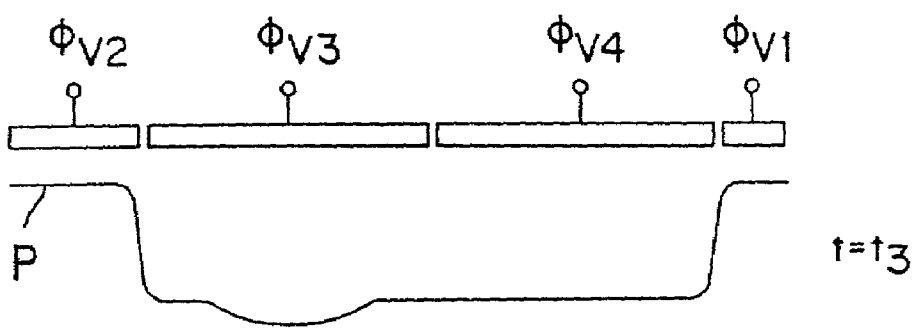
Figure 8C:
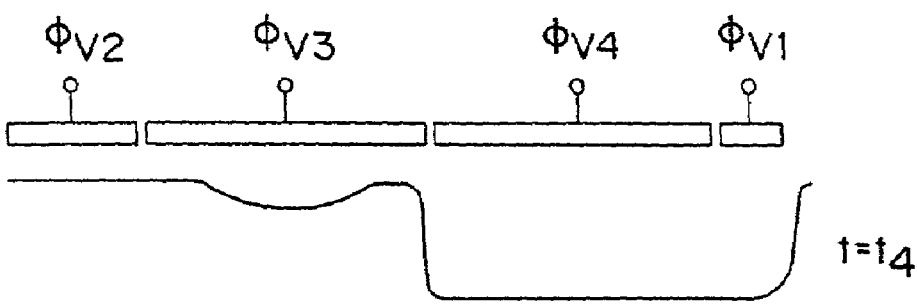

On the other hand, if the discharge gate 38 does not overlap the vertical CCD 22 as shown in FIG. 7A, the potential relationship is as shown in FIG. 7B, which is a cross sectional view along 7B—7B in FIG. 7A. That is, when a high voltage is applied to the discharge gate 38, charges are discharged from the vertical CCD 22 towards the discharge drain 29. On the other hand, as shown in FIGS. 8A–8C, which are cross sectional views of the potential along 8—8 in FIG. 7A at the time of a normal transfer, the potential well becomes deep at a portion 22A of the vertical CCD 22 adjacent to the discharge gate 38. This is because the narrow channel effect is relieved since the CCD width is enlarged at this portion 22A as shown in FIG. 7A.

Therefore, in the structure in FIG. 7A, it is considered that leftover charges occur at a portion where the potential P of the vertical CCD 22 is deep at the time of a vertical transfer as shown in FIGS. 8A–8C. It is noted that vertical drive pulse time t=t1–t5 in FIG. 2 is used to show the temporal change (t2, t3, t4) of the potential P in FIGS. 8A–8C.

Third Embodiment

Figure 9A:
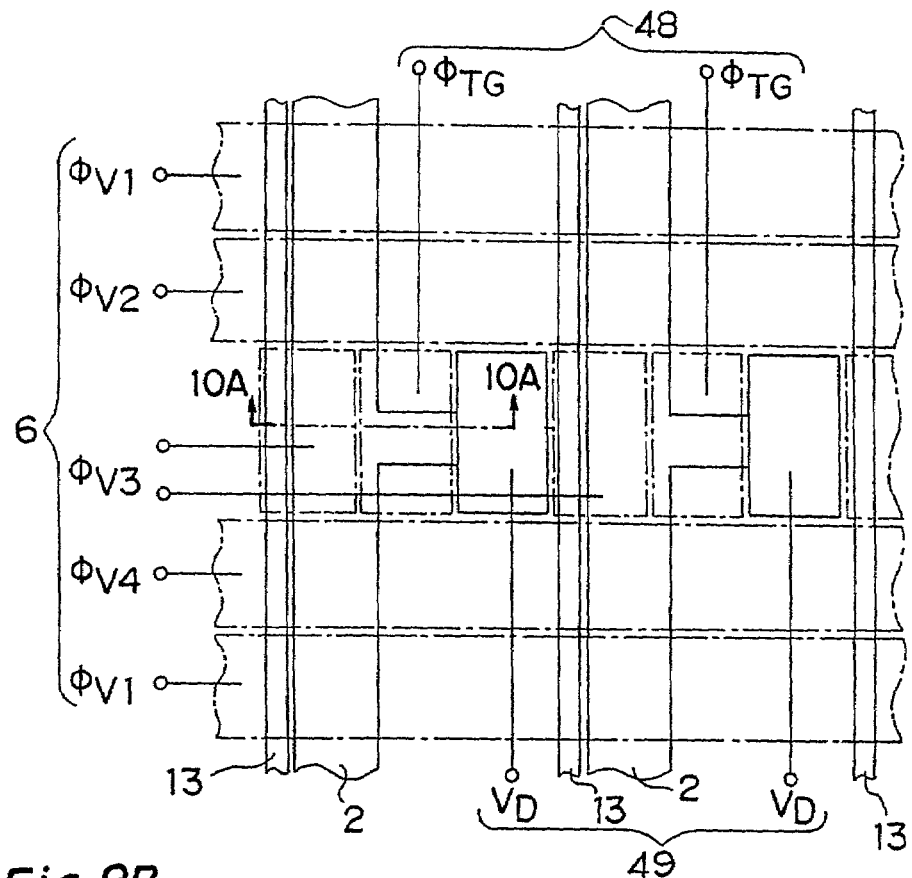
FIG. 9A a layout chart showing a structure according to a third embodiment of the invention.

FIG. 9A shows a layout according to a third embodiment. In the third embodiment, a voltage $V_D$ applied to the discharge drain 49 is made variable in the layout according to the second embodiment shown in FIG. 5A.

Figure 9B:
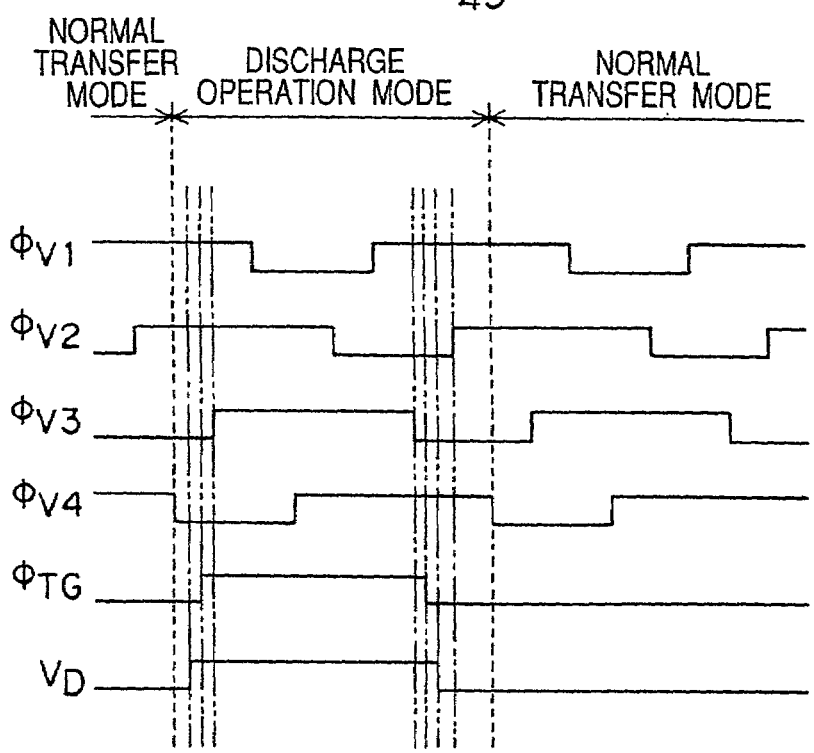
FIG. 9B is a drive timing chart.

FIG. 9B shows waveforms of signals $\phi_{V1}$–$\phi_{V4}$ to the transfer electrodes 6, a signal $\phi_{TG}$ to the discharge gate 48 and a voltage $V_D$ applied to the discharge drain 49 in the structure shown in FIG. 9A in a normal transfer mode and a discharge operation mode. In the third embodiment, a high voltage $V_D$ is applied to the discharge drain in a discharge operation mode during a period including a period when the signal $\phi_{TG}$ is high as shown in FIG. 9B.

Figure 10A:
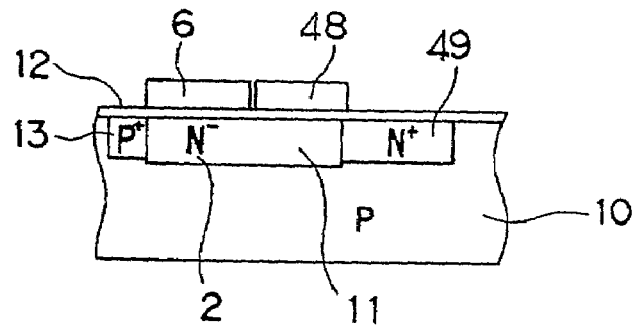
FIG. 10A is a cross sectional view along 10A—10A in FIG. 9A.
Figure 10B:
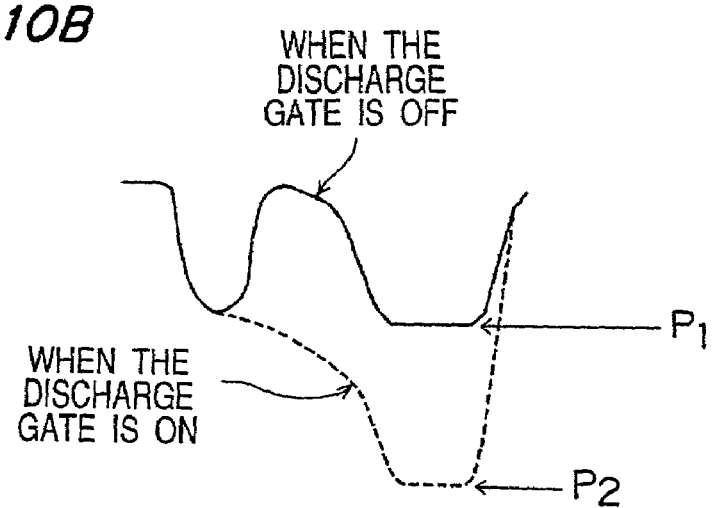
FIG. 10B shows the potential distribution corresponding to the cross sectional configuration in FIG. 10A.

FIG. 10A is a cross sectional view along 10A—10A in FIG. 9A. FIG. 10B shows a potential distribution corresponding to the cross sectional configuration in FIG. 10A. As shown with a solid line in FIG. 10B, the voltage $V_D$ applied to the discharge drain 49 is low and the potential well P1 of the discharge drain 49 is shallow when the discharge gate 48 is turned off. On the other hand, as shown with a broken line in FIG. 10B, a voltage $V_D$ applied to the discharge drain 49 is high and the potential P2 well of the discharge drain 49 is deep when the discharge gate 48 is turned on. However, the potential well of the discharge drain 49 is set to be deeper than the potential well under the discharge gate 48.

By this operation, when the discharge gate 48 is off, the potential P1 well of the discharge drain 49 is made shallower than the potential P2 well in the discharge operation so that part of charges in the vertical CCD 2 can be prevented from discharging to the discharge drain 49 via the discharge gate 48.

Therefore, according to the third embodiment, even when the pixel size is small, charge drain can be prevented at the time of a normal operation and a frame rate, resolution or the like can be easily changed for an arbitrary decimation rate.

Figure 10C:
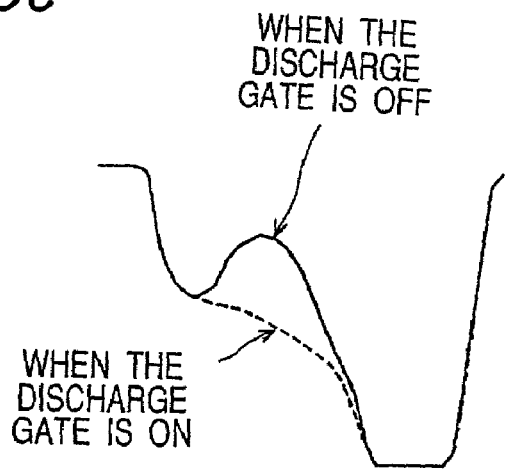
FIG. 10C shows the potential distribution of a comparative example of the third embodiment.

As shown with a solid line in FIG. 10C, when a voltage $V_D$ applied to the discharge drain 49 is fixed, there is a large potential difference between the region under the discharge gate 48 and the discharge drain 49 at the time of a normal transfer. Therefore, the potential under the discharge gate 48 is attracted by the potential of the discharge drain 49 due to the short channel effect and the potential well under the discharge gate 48 is made deeper than in the case shown in FIG. 10B. In this case, at the time of a normal transfer (the discharge gate is off), part of charges in the vertical CCD 2 can be discharged to the discharge drain 49 via the discharge gate 48. To prevent this defective transfer, the length of the discharge gate 48 has only to be extended, but this is difficult due to limited pixel dimensions.

Fourth Embodiment

Figure 11:
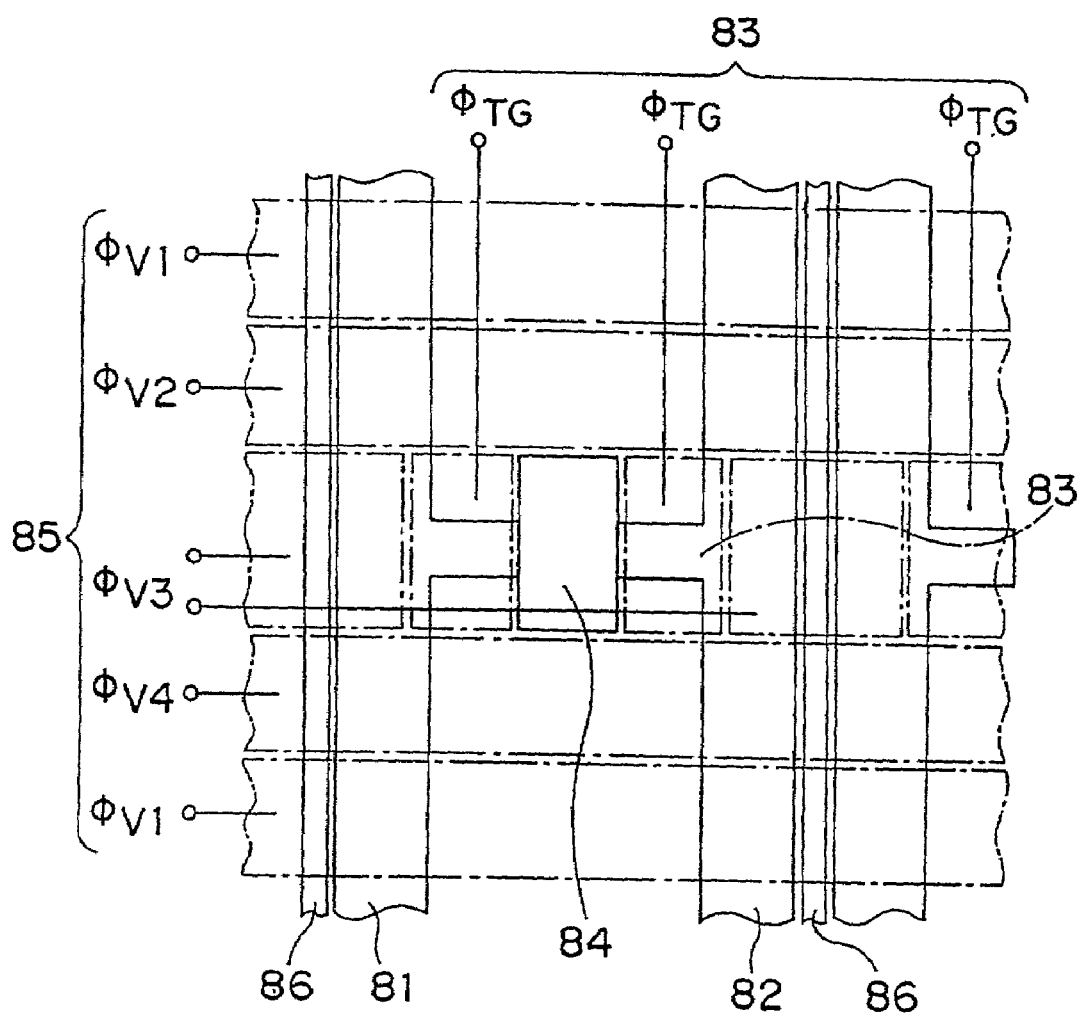
FIG. 11 is a layout chart showing the structure according to a fourth embodiment of the invention.

FIG. 11 shows the configuration of a solid-state image pickup device according to a fourth embodiment of the invention. The fourth embodiment is designed to reduce the pixel pitch.

As shown in FIG. 11, this embodiment is provided with a first vertical CCD 81, a second vertical CCD 82, a discharge gate 83, a discharge drain 84, vertical transfer electrodes 85 and a channel stop 86.

In the fourth embodiment, the discharge drain 84 is provided between the first vertical CCD 81 and the second vertical CCD 82. The discharge gates 83 are disposed adjacent to both sides of respective vertical CCD 81, 82 and sandwich the discharge drain 84.

As shown in, FIG. 11, since two vertical CCD 81, 82 share one discharge drain 84, a sufficient area where the discharge drain 84 and the discharge gate 83 are formed can be secured even when the pixel size is small.

In a discharge operation according to this embodiment, the discharge gate 83 has a high voltage and signal charges in the vertical CCD 81, 82 are discharged to the discharge drain 84 shared by the two vertical CCD 81, 82.

At this time, the channel stop 86 in a p-type region shown in FIG. 11 prevents exchanges of charges between the two vertical CCD 81, 82 and another neighboring vertical CCD.

Thus, according to this embodiment, since the discharge drain 84 is shared by two vertical CCD 81, 82, a solid-state image pickup device capable of discharge operation can be provided even when the pixel size is small.

Fifth Embodiment

Figure 12:
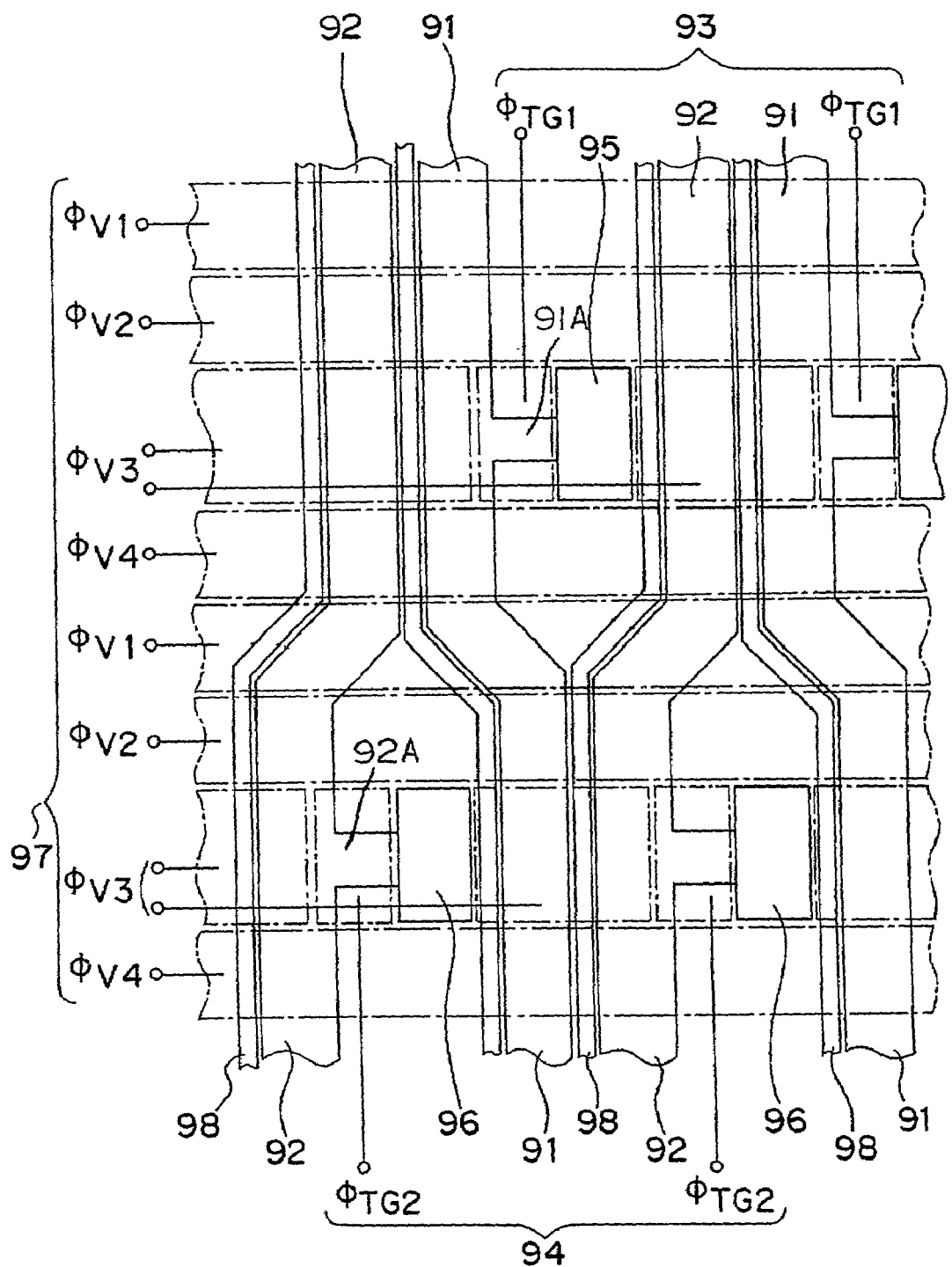
FIG. 12 is a layout chart showing a structure according to a fifth embodiment of the invention.

FIG. 12 shows a solid-state image pickup device according to a fifth embodiment of the invention. The fifth embodiment is designed to reduce the horizontal pitch by providing a plurality of stages of discharge drains.

The fifth embodiment is provided with a first vertical CCD 91, a second vertical CCD 92, a first discharge gate 93, a second discharge gate 94, a first discharge drain 95, a second discharge drain 96, vertical transfer electrodes 97 and a channel stop 98.

As shown in FIG. 12, the first vertical CCD 91 and the second vertical CCD 92 are alternately arrayed. The two neighboring vertical CCD extend distantly on the lower stage when they extend closely on the upper stage. When they extend closely on the upper stage, they extend distantly on the lower stage. That is, as shown in FIG. 12, the first vertical CCD 91 and the second vertical CCD 92 are arrayed so that close and distant extensions are repeated successively on the upper stages. On the other hand, on the lower stages, separate and close extensions are successively repeated in the phase opposite of the upper stages.

The first discharge drain 95 is disposed between the first vertical CCD 91 and the second vertical CCD 92 distantly disposed next to each other on the upper stage. The first discharge gate 93 is disposed between the first discharge drain 95 and the first vertical CCD 91. The first discharge gate 93 partially overlaps the first vertical CCD 91. The approximately central portion of the first vertical CCD 91 portion overlapping the first discharge gate 93 has an extending portion 91A extending to the first discharge drain 95.

The second discharge drain 96 is disposed between the second vertical CCD 92 and the first vertical CCD 91 distantly disposed next to each other. The second discharge gate 94 is disposed between the second discharge drain 96 and the second vertical CCD 92. The second discharge gate 94 partially overlaps the second vertical CCD 92. The approximately central portion of the second vertical CCD 92 portion overlapping the second discharge gate 94 has an extending portion 92A extending to the second discharge drain 94.

Thus, the fifth embodiment has a two-stage structure with the first discharge drain 95 and the second discharge drain 96 on the upper and lower stages, respectively. The first discharge drain 95 and the first discharge gate 93 are provided to every other vertical CCD, which is the first vertical CCD 91. On the lower stage, the second discharge drain 96 and the second discharge gate 94 are provided to the second vertical CCD 92 where the discharge drain is not provided in the upper stage so that signal charges in all the vertical CCD can be discharged.

Figure 13:
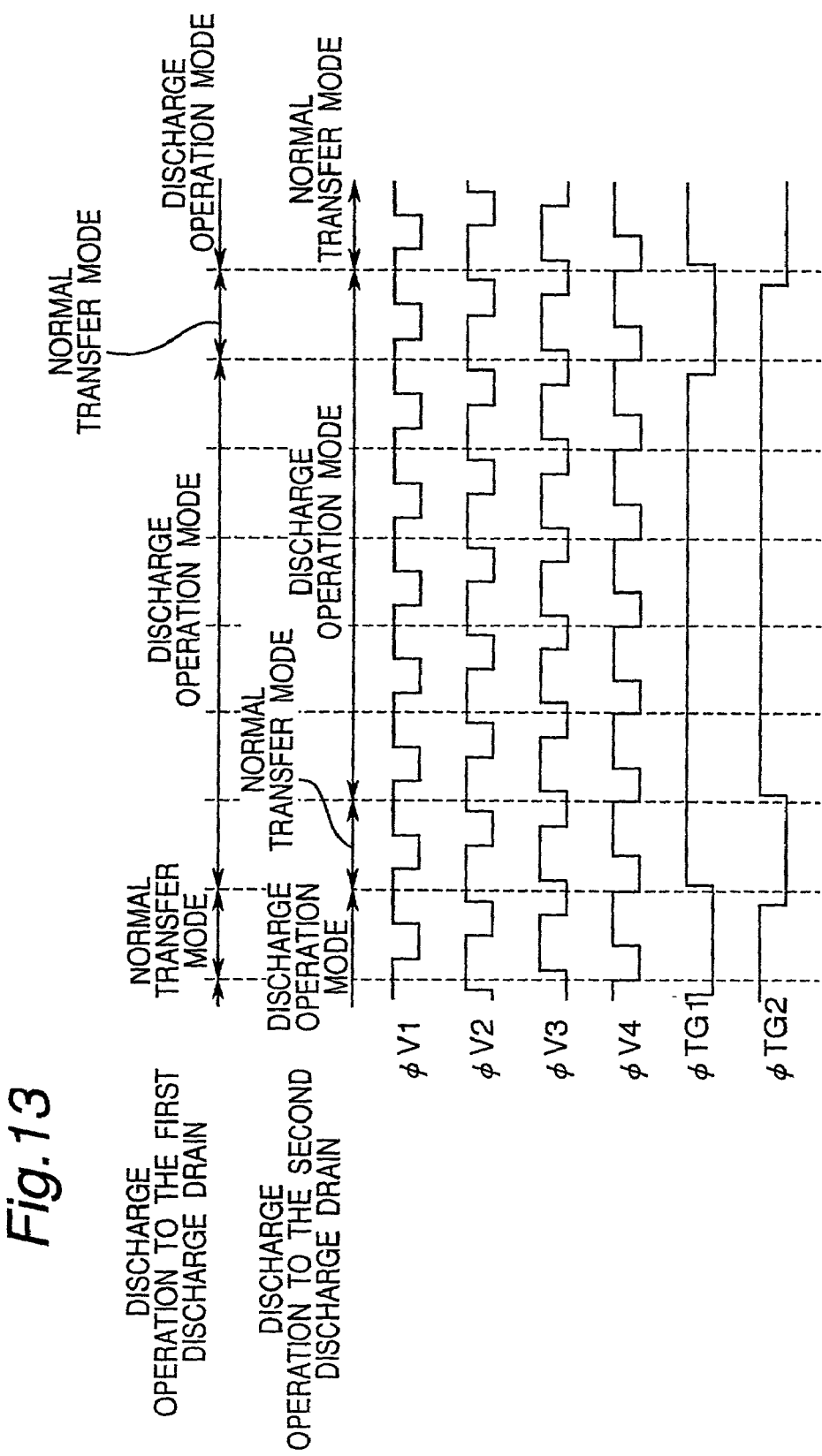
FIG. 13 is a drive timing chart of the fifth embodiment.
Figure 14:
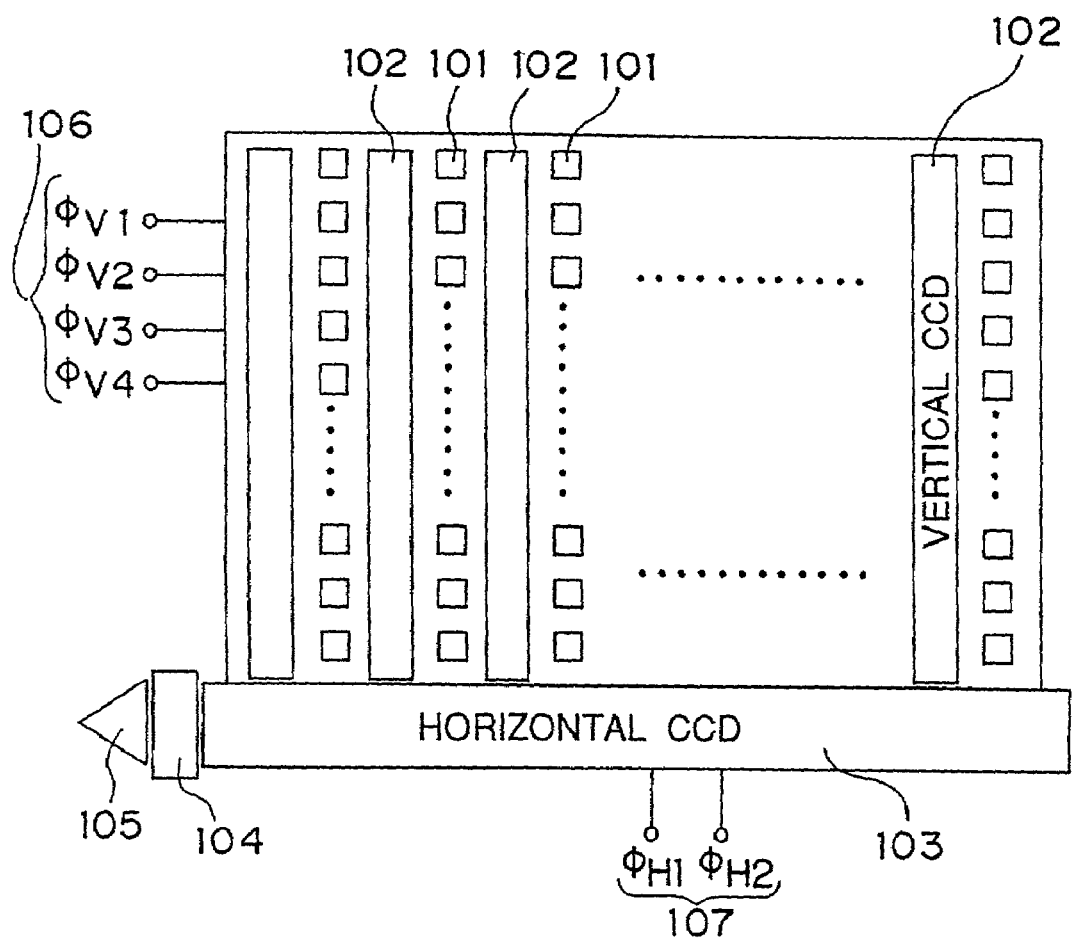
FIG. 14 shows a structure of a conventional two-dimensional image sensor.
Figure 15:
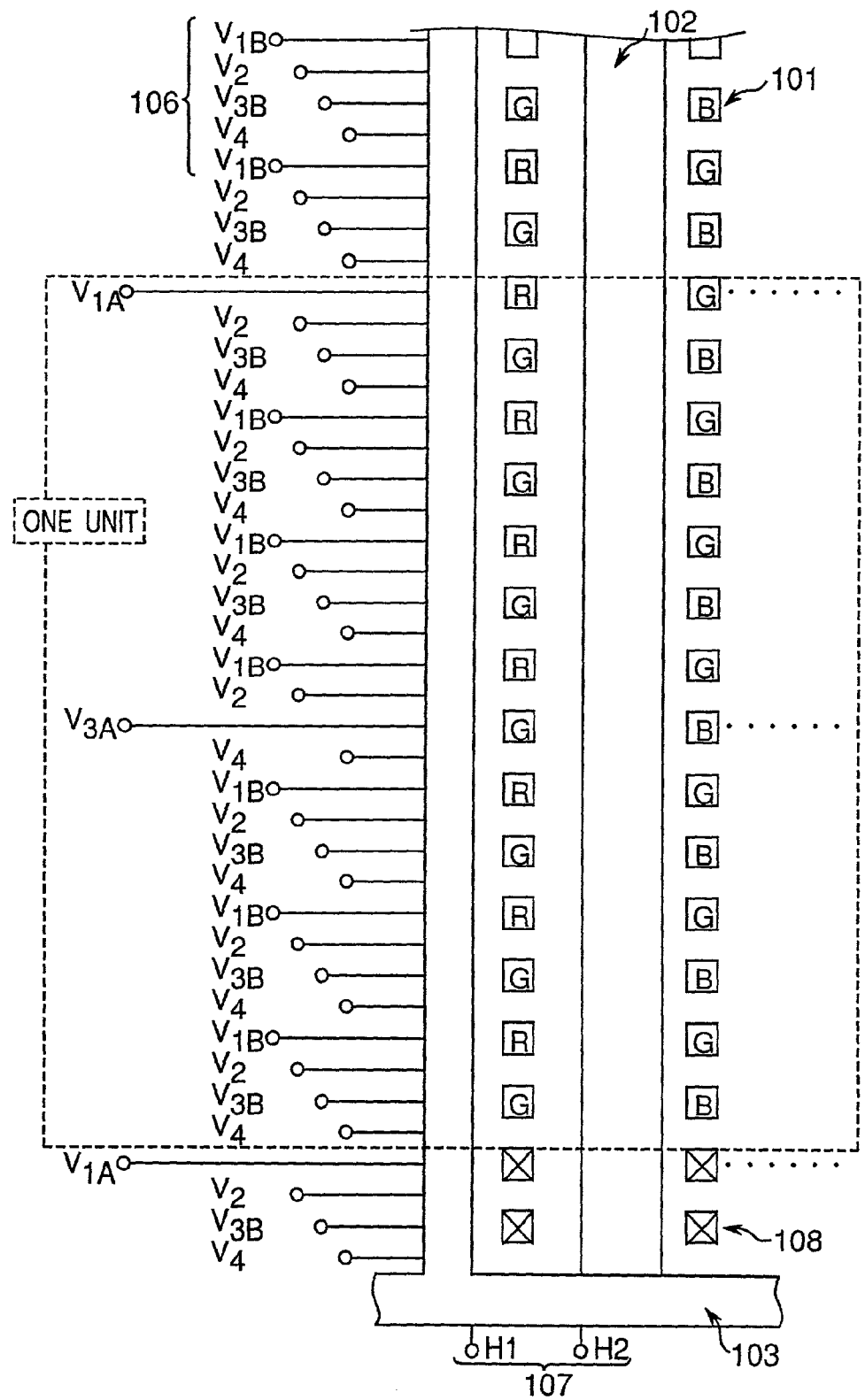
FIG. 15 is a more detailed device configuration view of the conventional image sensor.
Figure 16:
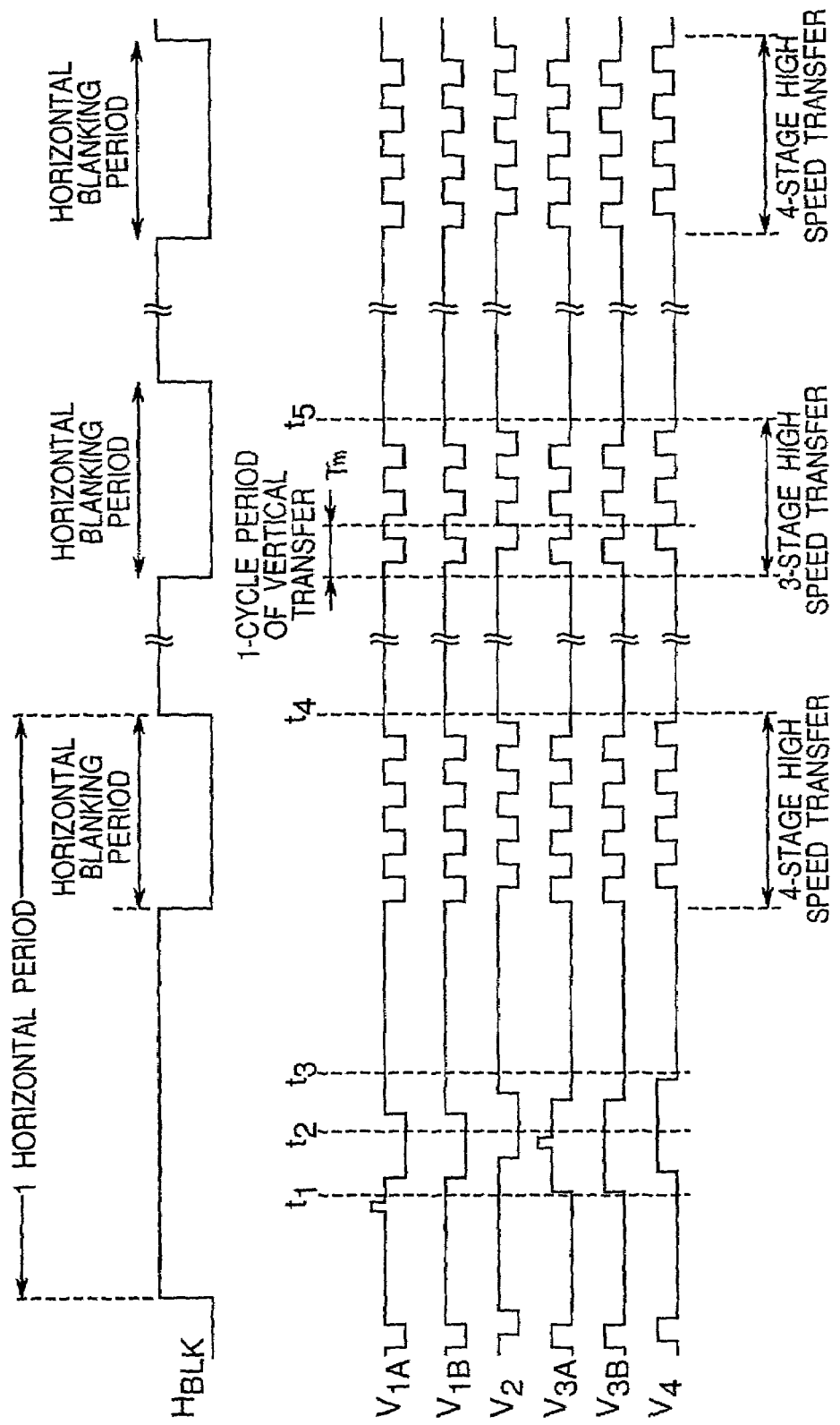
FIG. 16 is a drive timing chart of the conventional image sensor in a monitoring mode.
Figure 17:
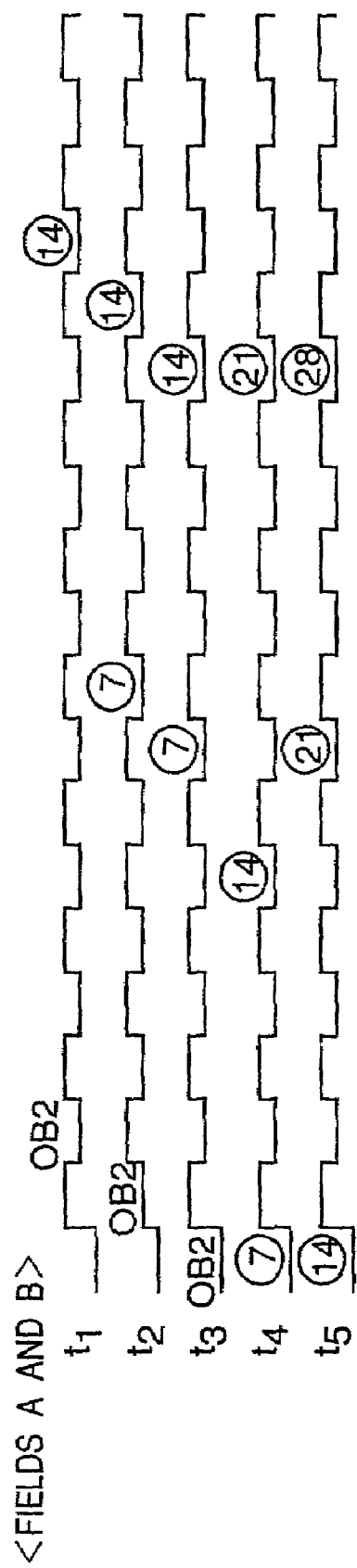
FIG. 17 is a potential chart showing a signal transfer state in a monitoring mode of the conventional image sensor.

FIG. 13 shows a drive timing in the structure shown in FIG. 12 in a discharge operation. This drive timing chart shows a 1/7 decimation monitoring mode.

In this embodiment as well, the vertical CCD 91, 92 operate in the same drive timing as at the time of a normal transfer (still mode). As shown with waveforms of gate signals $\phi_{TG1}$ and $\phi_{TG2}$ in this timing chart, the first discharge gate 93 has a timing 1 packet ahead of the on period (discharge operation mode) of the second discharge gate 94.

Thus, signal charges for one line can be decimated by shifting 1 packet in the timing of the discharge operation. After a normal operation is performed only for 1 packet (2 pixels) while the first and second discharge gates 93, 94 are in an off state, a discharge operation is performed while these gates are on for 6 packets (12 pixels).

Signals of different colors for 2 pixels can be outputted for 3 packets (6 pixels) or 4 packets (8 pixels) by repeating this operation in fields A and B.

When a plurality of stages of discharge drains 95, 96 are provided as in the case of the fifth embodiment, pixel signals for 1 line can be decimated regardless of the positions of the discharge gates 93, 94 and the discharge drains 95, 96 by shifting the drive timings of the discharge gates 93, 94 on respective stages.

In the fifth embodiment, the 1/7-decimation monitoring mode is described, but operations can be achieved at any decimation rate such as 1/4, 1/5, 1/6, 1/8 or the like by changing the drive timing. That is, pixel signals to be decimated are discharged while the discharge gate is on. The required pixel signals are transferred towards the horizontal CCD when the discharge gate is turned off.

When a low voltage is applied to one of the discharge gates 93, 94 of the discharge drains 95, 96 on the upper and lower stages to keep its off state and a high voltage is applied to the other discharge drain to turn it on, a normal transfer is performed in one of the neighboring vertical CCD and a discharge operation is performed in the other vertical CCD. As a result, decimation where every other signal is processed in 1 line is performed.

Every other vertical CCD has a two-stage structure in the vertical direction in the structure shown in FIG. 12, but the two-stage structure in the vertical direction does not need to be provided to every other vertical CCD. Combination of vertical CCD provided with a discharge drain and vertical CCD not provided with a discharge drain can be set arbitrarily. There is no limit to the number of stages in the vertical direction and a plurality of stages may be provided.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid-state image pickup device comprising a plurality of light receiving sections formed on a semiconductor substrate, at least one vertical transfer section for transferring charges read from the light receiving sections in a vertical direction and a horizontal transfer section for transferring charges transferred by the vertical transfer section in a horizontal direction, wherein said solid-state image pickup device is provided with a charge discharge gate which is formed adjacent to a connection of each vertical transfer section and the horizontal transfer section and depletes charges in each vertical transfer section and a charge discharge drain formed adjacent to each charge discharge gate, and signal charges in the vertical transfer section are discharged from each charge discharge gate to each charge discharge drain by simultaneously applying voltages having high-low voltage ratios corresponding to decimation ratios to the charge discharge gates for performing an arbitrary decimation.

2. The solid-state image pickup device according to claim 1, wherein a layer directly under the gate having the same conductive type as that of the vertical transfer section is formed under the discharge gate positioned between the vertical transfer section and the discharge drain.

3. The solid-state image pickup device according to claim 1, wherein a layer directly under the gate having the same conductive type as that of the vertical transfer section is formed under the discharge gate positioned between the vertical transfer section and the discharge drain in the same process of forming the vertical transfer section.

4. The solid-state image pickup device according to claim 1, wherein the discharge gate covers at least part of the vertical transfer section.

5. The solid-state image pickup device according to claim 1, wherein a voltage applied to the discharge drain is made variable and a drive timing of a voltage applied to the discharge drain is synchronized with a drive timing of a voltage applied to the discharge gate.

6. The solid-state image pickup device according to claim 5, wherein a pulse width applied to the discharge drain covers at least a pulse applied to the discharge gate in a discharge operation mode where the discharge drain is driven while synchronized with driving of the discharge gate.

7. The solid-state image pickup device according to claim 1, wherein one discharge drain is provided between the neighboring vertical transfer sections and signal charges in the two vertical transfer sections positioned on both sides of the discharge drain are discharged to this one discharge drain via the discharge gate provided adjacent to the vertical transfer sections.

8. The solid-state image pickup device according to claim 1, wherein the vertical transfer section provided with the discharge drain and the vertical transfer section not provided with the discharge drain are arbitrarily set and the combinations of the set discharge drains are arranged on a plurality of stages in the vertical direction.

9. The solid-state image pickup device according to claim 1, wherein each charge discharge gate and each charge discharge drain are formed adjacent to each connection of the vertical transfer section and the horizontal transfer section.

* * * * *